(12) United States Patent
Huang et al.

(10) Patent No.: US 9,136,166 B2
(45) Date of Patent: Sep. 15, 2015

(54) INTERCONNECT STRUCTURE AND METHODS OF MAKING SAME

(71) Applicant: Taiwan Semiconductor Manufacturing Company, Ltd., Hsin-Chu (TW)

(72) Inventors: Tsung-Min Huang, Taichung (TW); Chung-Ju Lee, Hsin-Chu (TW); Tsung-Jung Tsai, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/791,352

(22) Filed: Mar. 8, 2013

(65) Prior Publication Data

US 2014/0252628 A1   Sep. 11, 2014

(51) Int. Cl.
*H01L 21/768* (2006.01)
*H01L 23/532* (2006.01)

(52) U.S. Cl.
CPC ..... *H01L 21/76883* (2013.01); *H01L 23/53228* (2013.01); *H01L 23/53233* (2013.01)

(58) Field of Classification Search
CPC .............. H01L 23/53238; H01L 2924/01029; H01L 21/76849; H01L 21/2885; H01L 21/76858
USPC ........... 257/762, 750, 751, 774; 438/687, 678
See application file for complete search history.

(56) References Cited

U.S. PATENT DOCUMENTS

| | | | | |
|---|---|---|---|---|
| 5,686,760 A * | 11/1997 | Miyakawa | | 257/751 |
| 6,218,302 B1 * | 4/2001 | Braeckelmann et al. | | 438/687 |
| 6,291,082 B1 * | 9/2001 | Lopatin | | 428/621 |
| 6,333,248 B1 * | 12/2001 | Kishimoto | | 438/586 |
| 6,342,691 B1 * | 1/2002 | Johnsgard et al. | | 219/390 |
| 6,809,035 B2 * | 10/2004 | Yoo | | 438/709 |
| 7,351,656 B2 * | 4/2008 | Sakata et al. | | 438/672 |
| 7,485,561 B2 * | 2/2009 | Basol | | 438/610 |
| 7,855,147 B1 * | 12/2010 | Dulkin et al. | | 438/676 |
| 8,802,560 B1 * | 8/2014 | Lu et al. | | 438/631 |
| 2003/0224592 A1 * | 12/2003 | Harada | | 438/622 |
| 2004/0023504 A1 * | 2/2004 | Yoo | | 438/709 |
| 2006/0014396 A1 * | 1/2006 | Chen et al. | | 438/757 |
| 2006/0138670 A1 * | 6/2006 | Lee | | 257/762 |
| 2006/0163731 A1 * | 7/2006 | Inoue | | 257/751 |
| 2009/0108464 A1 * | 4/2009 | Uchiyama | | 257/774 |
| 2009/0117732 A1 * | 5/2009 | Shin | | 438/653 |
| 2009/0218694 A1 * | 9/2009 | Kato et al. | | 257/751 |
| 2010/0285660 A1 * | 11/2010 | Lin et al. | | 438/650 |
| 2011/0006429 A1 * | 1/2011 | Liu et al. | | 257/751 |
| 2011/0114940 A1 * | 5/2011 | Kim et al. | | 257/43 |
| 2011/0151662 A1 * | 6/2011 | Koura et al. | | 438/653 |
| 2014/0015104 A1 * | 1/2014 | Su et al. | | 257/611 |
| 2014/0048878 A1 * | 2/2014 | Xiao | | 257/343 |
| 2014/0252618 A1 * | 9/2014 | Peng et al. | | 257/751 |

\* cited by examiner

*Primary Examiner* — Zandra Smith
*Assistant Examiner* — Jaehwan Oh
(74) *Attorney, Agent, or Firm* — Slater & Matsil, L.L.P.

(57) ABSTRACT

A method for forming a semiconductor interconnect structure comprises forming a dielectric layer on a substrate and patterning the dielectric layer to form an opening therein. The opening is filled and the dielectric layer is covered with a metal layer having a first etch rate. The metal layer is thereafter planarized so that the metal layer is co-planar with the top of the dielectric layer. The metal layer is annealed to change the first etch rate into a second etch rate, the second etch rate being lower than the first etch rate. A copper-containing layer is formed over the annealed metal layer and the dielectric layer. The copper-containing layer has an etch rate greater than the second etch rate of the annealed metal layer. The copper-containing layer is etched to form interconnect features, wherein the etching stops at the top of the annealed metal layer and does not etch thereunder.

20 Claims, 6 Drawing Sheets

INTERCONNECT STRUCTURE AND METHODS OF MAKING SAME

BACKGROUND

Since the mid-1990's so-called damascene processes have been the dominant technology for forming conductive interconnects in integrated circuits. Those skilled in the art recognize that damascene processing involves forming openings (via and trenches) in a dielectric layer and then filling the openings with a conductive, typically copper. The copper is typically deposited by initially depositing a thin seed layer within the openings and then filling the openings by electroplating copper.

Figure 1:
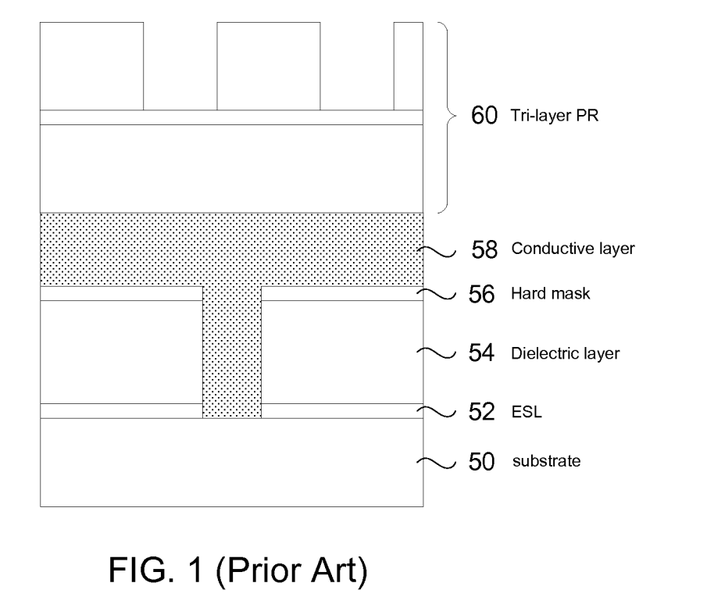
FIGS. 1 and 2 are cross-sectional views of a part of an interconnect structure of a semiconductor device from the prior art.
Figure 2:
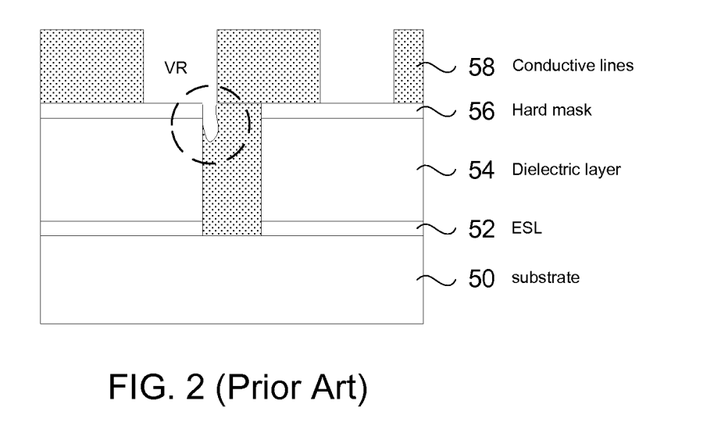

FIG. 1 is a cross-sectional view of an interconnect formed on a semiconductor device from the prior art. In the figure, a patterned dielectric layer 54 is formed on a substrate 50. Formed between an opening of the patterned dielectric layer 54 and thereabove is a conductive layer 58. Formed between the dielectric layer 54 and the conductive layer 58 is a hard mask 56. A mask layer, such as a tri-layer photoresist layer 60 is formed above the conductive layer 58. In a later process, using the tri-layer photoresist layer 60 as a mask, the conductive layer 58 will be etched to form conductive lines 58 above the dielectric layer 54, as shown in FIG. 2.

The conventional copper metal line formation method can have a number of problems. One problem may be misalignment. In the process of device feature or pattern exposure, the alignment between successive layers that are being created is of critical importance. Smaller device dimensions place even more stringent requirements on the accuracy of the alignment of the successive layers that are superimposed on each other. In FIG. 2, following the etching of the conductive layer 58 in which the photoresist layer 60 is used as a mask to form conductive lines 58, via recesses VR may be formed at the juncture of a conductive line 58 and the hard mask 56 and/or the dielectric layer 54. Via recesses can be caused when the photoresist layer is misaligned (e.g., shifted to one side). Such misalignment can result from a mask misalignment failure, for example, during the photolithography process. Due to this misalignment, the via recess formed can be a serious problem in the conventional copper etch approach by causing unstable yield and decreased reliability.

BRIEF DESCRIPTION OF DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having ordinary skill in the art will recognize that embodiments of the disclosure can be practiced without these specific details. In some instances, well-known structures and processes are not described in detail to avoid unnecessarily obscuring embodiments of the present disclosure.

Embodiments will be described with respect to a specific context, namely an interconnect structure for an integrated circuit. Other embodiments may also be applied, however, to other semiconductor devices and features. For instance, the present teachings could be applied to structures other than an integrated circuit, such as an interposer device, a printed circuit board, a package substrate, and the like.

Figure 3:
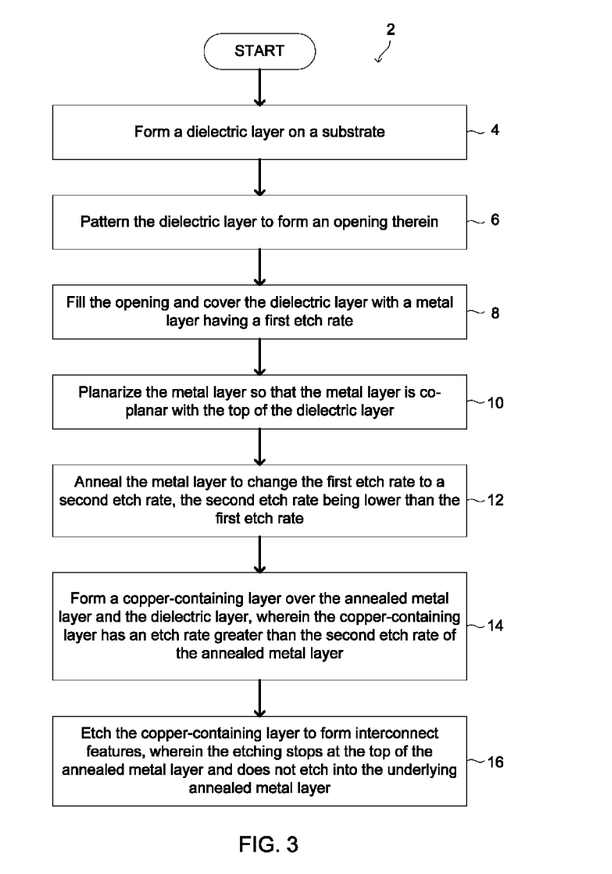
FIG. 3 is a flowchart of a method of fabricating an interconnect structure of a semiconductor device according to various embodiments of the present disclosure.

With reference now to FIG. 3, there is shown a flowchart of a method 2 for fabricating an interconnect structure of a semiconductor device according to various aspects of the present disclosure. Referring to FIG. 3, the method 2 includes block 4, in which a dielectric layer is formed on a substrate. The method 2 includes block 6, in which the dielectric layer is patterned to form an opening therein. The method 2 includes block 8, in which the opening is filled and the dielectric layer is covered with a metal layer having a first etch rate. The method 2 includes block 10, in which the metal layer is planarized so that the metal layer is co-planar with the top of the dielectric layer. The method 2 includes block 12, in which the metal layer is annealed to change the first etch rate to a second etch rate, the second etch rate being lower than the first etch rate. It will be understood that when relative terms such as first etch rate, second etch rate, lower etch rate, etc., are used in the present disclosure, these terms are used to describe the etch characteristics of the material when exposed to a same etch process. In other words, etch rate prior to e.g., annealing, when exposed to a given etch process is higher than the same materials etch rate, after annealing, when exposed to the same or similar etch process. The method 2 includes block 14, in which a copper-containing layer is formed over the annealed metal layer and the dielectric layer. The copper-containing layer has an etch rate greater than the second etch rate of the annealed metal layer. The method 2 includes block 16, in which the copper-containing layer is etched to form interconnect features. The etching stops at the top of the annealed metal layer and does not etch into the underlying annealed metal layer.

It is understood that additional processes may be performed before, during, or after the blocks 4-16 shown in FIG. 3 to complete the fabrication of the semiconductor device, but these additional processes are not discussed herein in detail for the sake of simplicity.

FIGS. 4-10 are diagrammatic fragmentary cross-sectional side views of a portion of a wafer at various fabrication stages according to embodiments of the method 2 of FIG. 3. It is understood that FIGS. 4-10 have been simplified for a better understanding of the inventive concepts of the present disclosure. It should be appreciated that the materials, geometries, dimensions, structures, and process parameters described herein are exemplary only, and are not intended to be, and should not be construed to be, limiting to the invention claimed herein. Many alternatives and modifications will be apparent to those skilled in the art, once informed by the present disclosure.

Figure 4:
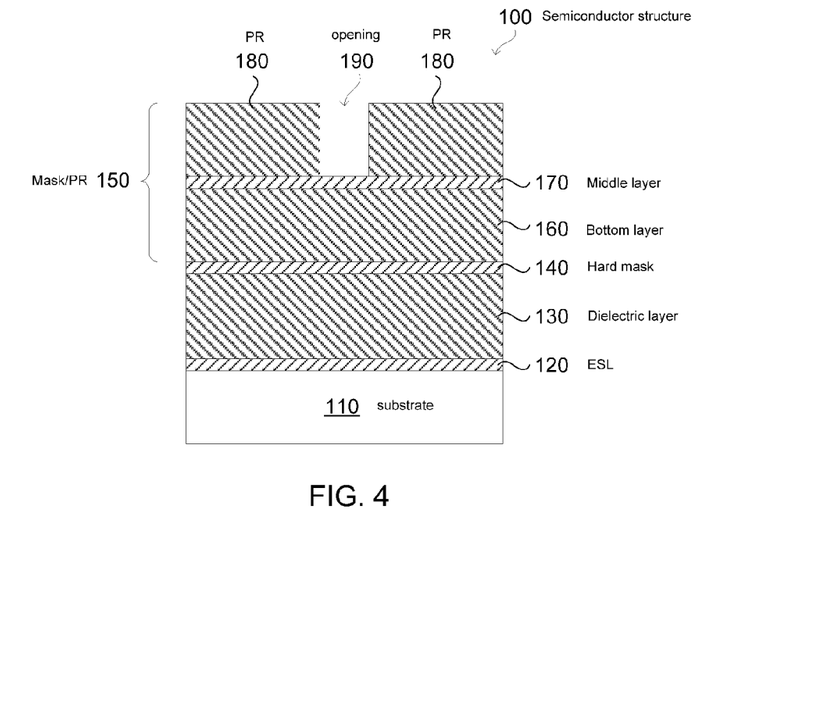
FIGS. 4-10 are diagrammatic fragmentary cross-sectional side views of a portion of a wafer at various stages of fabrication in accordance with various embodiments of the present disclosure.

With reference now to FIG. 4, there is shown an illustrative semiconductor structure 100 shown in highly simplified cross-sectional views. Various features not necessary for understanding of the invention have been omitted for sake of clarity and brevity. Semiconductor structure 100 includes a substrate 110 upon which has been formed an etch stop layer 120. Substrate 110 refers generally to any structures or materials underlying etch stop layer 120. In some applications, substrate 110 includes a semiconductor wafer such as a bulk silicon wafer or a silicon (or other semiconductor material) layer formed atop a bulk wafer and separated therefrom by, e.g., a buried oxide layer in a so-called silicon on insulator (SOI) arrangement. One or more active or passive devices, such as transistors or capacitors, could be formed in substrate 110. In another application, substrate 110 could be an underlying metal (or other conductor) layer in a multi-metal interconnect scheme. For instance, substrate 110 could be an underlying metal layer (or several stacked metal layers) manufactured according to the steps illustrated in FIGS. 4-10.

A dielectric layer 130, preferably a low-k dielectric layer 130 is formed on the etch stop layer 120. Low k generally refers to a dielectric layer having a dielectric constant of less than about 3.5. Materials such as porous silicon oxide, doped silicon oxide, silicon carbide, silicon oxynitride, and the like could be employed for dielectric layer 130, although these are examples only and are not intended to be exhaustive or limiting. The dielectric layer 130 may be formed on the etch stop layer 120 by a process such as, for example vapor deposition, plasma-enhanced chemical vapor deposition, spin on coating, or other like processes.

Hard mask 140 is formed atop dielectric layer 130. In a case where dielectric layer 130 is an oxide, hard mask 140 could be, for example, silicon nitride or another material that has a high degree of resistance to etchants typically employed to etch oxides. Other materials, such as SiCN, SiOC, and the like could also be employed for hard mask 140.

Mask 150 is formed atop hard mask 140. In the illustrated embodiment, mask 150 is a tri-layer mask comprising three separate layers. While a conventional mask layer, such as a single polymer photoresist layer, could be employed, a tri-layer mask 150 allows for the formation of finer features having smaller dimensions and pitch. In the illustrated embodiment, bottom layer 160 of tri-layer mask 150 is a carbon organic layer, similar to a conventional photoresist layer. Middle layer 170 is a silicon containing carbon film, employed to help pattern bottom layer 160. Top layer 180 is a photoresist material, such as for instance, a photoresist material designed for exposure to 193 nm wavelengths, and preferably designed for immersion photolithography, for instance.

Figure 5:
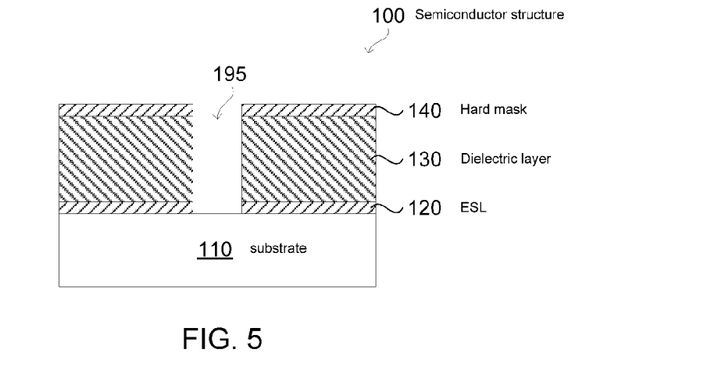

As shown in FIG. 4, an opening 190 is formed in mask 150, using known lithography techniques, such as for instance, immersion photolithography. This opening will be transferred to all layers of mask 150, through hard mask 140 and then to dielectric layer 130 and etch stop layer 120, resulting in an opening 195, sometimes referred to herein as a via opening, being formed in dielectric layer 130 and etch stop layer 120, as shown in FIG. 5. Note that opening 195 exposes an underlying portion of substrate 110 which, as described above, could be an underlying conductive interconnect, a transistor contact, or the like. Mask 150 is removed using known ashing and/or etching techniques, the details of which are omitted herein.

Figure 6:
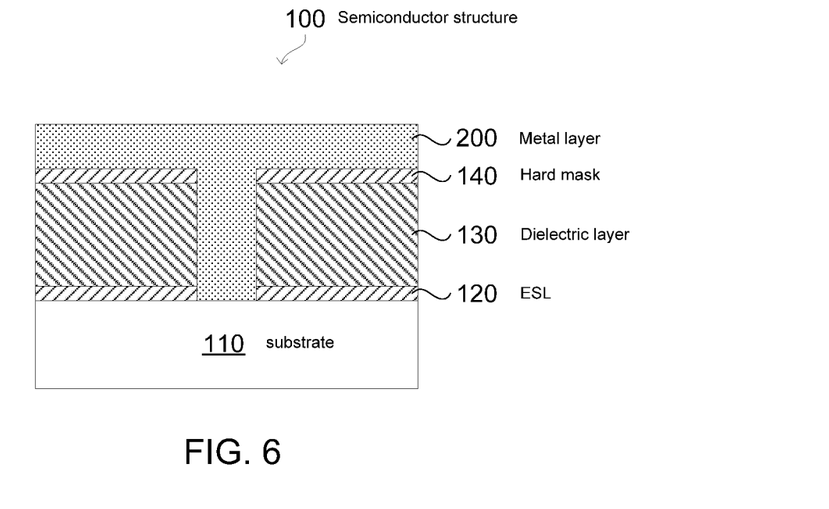

Turning now to FIG. 6, a metal layer 200 is deposited over semiconductor structure 100, the metal layer 200 having a first etch rate. In illustrated embodiments, a material of the metal layer 200 is a copper alloy. Examples of a suitable copper alloy include CuMn, CuCr, CuV, CuNb, and CuTi. The copper alloy may be in the range of from about 90% copper to about 99.8% copper. Other suitable alloys and percentages will be apparent to those skilled in the art upon undertaking routine experimentation once informed by the present disclosure. By using a copper alloy material, it is possible to manufacture copper interconnects without the need to form barrier lines, such as Ta, TaN, and the like, that are commonly employed in conventional damascene processes. That being said, it is within the contemplated scope of the present invention that a barrier liner could be employed in some applications.

In one embodiment, metal layer 200 is formed by a plasma vapor deposition (PVD) that completely fills opening 195 and forms a blanket coating over a top surface of dielectric layer 130, or more accurately over the top surface of hard mask 140 overlying dielectric layer 130. In some embodiments, hard mask 140 may be omitted, in which case metal layer 200 would be formed on dielectric layer 130. Metal layer 200 may be formed to a thickness above dielectric layer 130 of from about 500 A to about 2 um, depending upon the desired application and the technology node employed.

In another embodiment, metal layer 200 is formed by first depositing a seed layer by, e.g., physical vapor deposition techniques. The seed layer could be formed to a thickness of perhaps about 20 A to about 100 A, although other thicknesses could be employed depending upon the application and the desired process. Then a copper alloy material is formed on the seed layer using, e.g., an electro-plating or electro-less plating technique.

Figure 7:
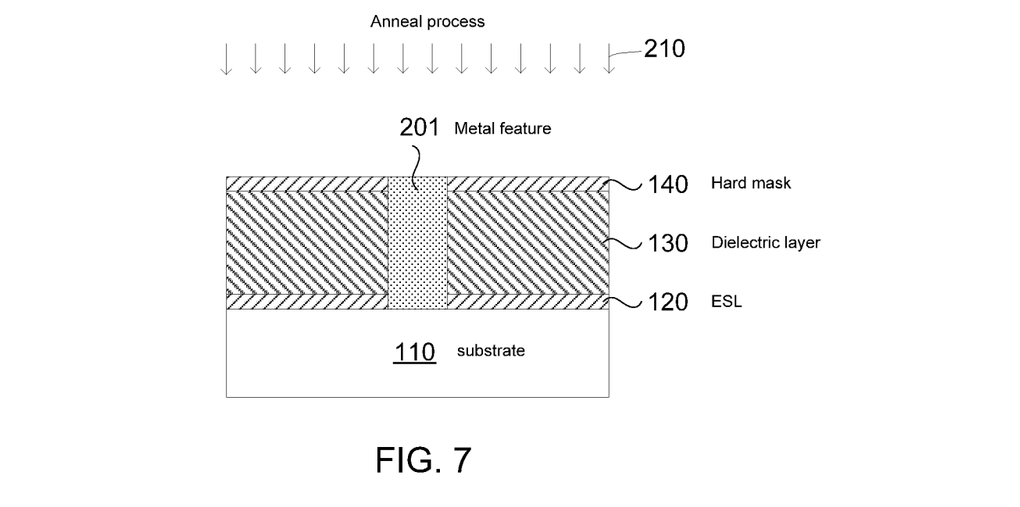
Figure 11:
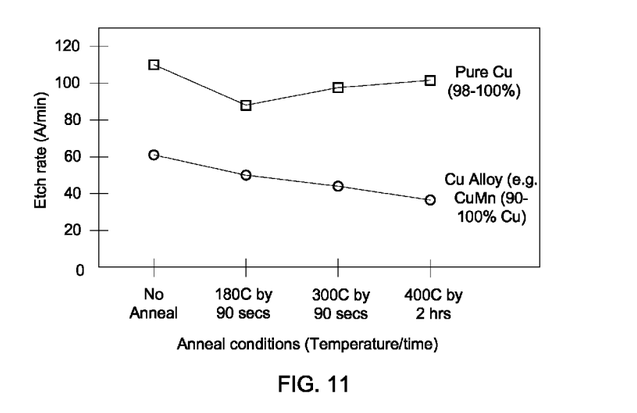
FIG. 11 is a chart showing different etch rates of copper alloy and pure copper at different annealing conditions.

The metal layer 200 is planarized by a chemical mechanical polishing (CMP) or an etch back step, for example to form a metal feature 201 whose top is substantially co-planar with a top surface of the hard mask layer 140, as illustrated in FIG. 7. Also shown in FIG. 7, in an aspect of the present disclosure, an anneal or heat process 210 is applied to the semiconductor structure 100 to control the etch rate of the copper alloy in the metal feature 201. The etch rate of the copper alloy in the metal feature 201 is changed from the first etch rate to a second etch rate, the second etch rate being lower than the first etch rate. The anneal process 210 may be a rapid thermal anneal (RTA), a laser anneal, and/or a flash lamp anneal. The anneal process may be conducted in an oxygen ambient, a combination of steam ambient and oxygen ambient combined, or under an inert gas atmosphere. The annealing may be performed in a single wafer rapid thermal annealing (RTP) system or a batch type furnace system or the anneal procedure can be performed in situ in the same tool. In an exemplary embodiment, the semiconductor structure 100 is placed in an inert environment, such as 95% H2, 5% N2 and annealed at a temperature of from about room temperature about 400 C for a time period of from about 1 minute to about 180 minutes, for example. As a result of the annealing, the copper alloy in the metal feature 201 is densified so that an etching rate of the annealed metal feature 201 is significantly reduced to be less than or equal to about 80-85 percent of an etching rate of the metal feature 201 before being annealed. The annealing can be tailored to achieve the desired etching rate. FIG. 11 is a chart showing different etch rates of copper alloy versus pure copper at different annealing conditions. This will be discussed in further detail below but as can be seen from FIG. 11, the copper alloy in the metal layer 200 or the metal feature 201 has an etching rate of about 60.0 A/min before annealing. However, when the copper alloy is annealed at a temperature of about 180 C, the copper alloy is densified so that the etching rate is reduced to about 52 A/min. At an annealing temperature of 300 C for about 90 seconds, the etching rate of the copper alloy is further reduced to about 42 A/min. When the copper alloy is annealed at a temperature of about 400 C, the copper alloy is further densified so that the etching rate is reduced further still to about 38 A/min.

Figure 8:
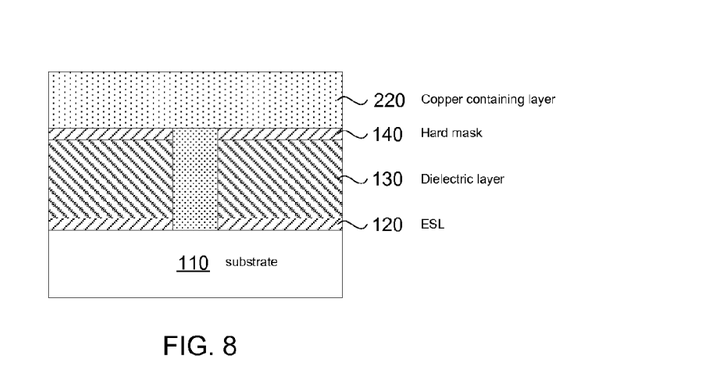

Referring now to FIG. 8, a copper containing layer 220 is deposited over the annealed metal feature 201 and the hard mask 140. In an exemplary embodiment, the copper containing layer 220 has from about 98% to about 100% copper and has an etch rate greater than the etch rate of the copper alloy in the annealed metal layer 200. The copper containing layer 220 may be deposited by plasma vapor deposition (PVD), for example. The copper containing layer 220 is thereafter thinned down (e.g., via chemical mechanical polish, CMP, by etch back, or the like).

Although not shown in FIG. 8, an etch stop layer may be formed on the planarized copper containing layer 220. In one embodiment, the etch stop layer is formed of silicon nitride, silicon carbon nitride, or another material that provides sufficient etch selectivity relative to the copper containing layer 220.

Figure 9:
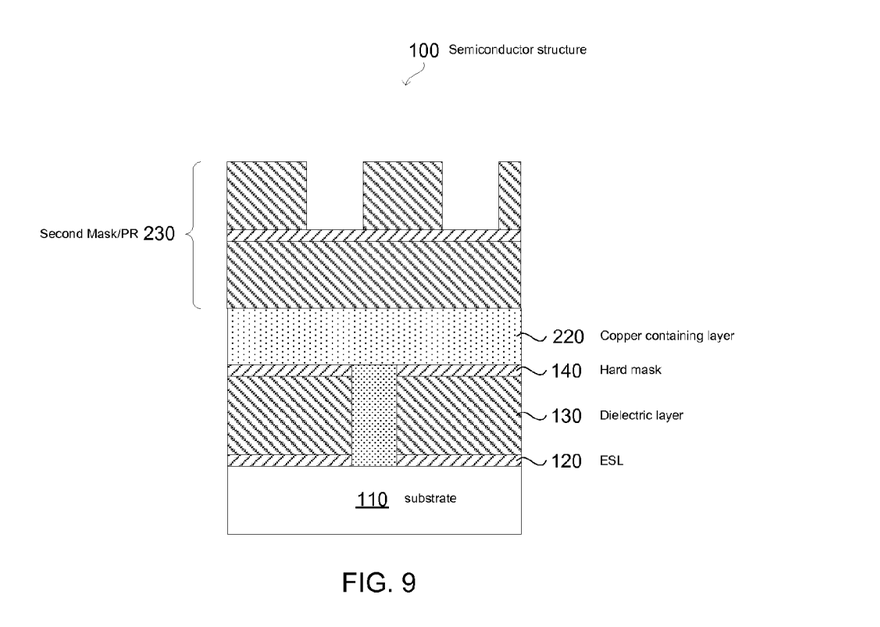
Figure 10:
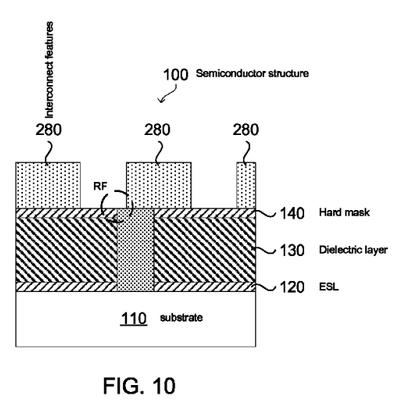

Turning now to FIG. 9, a second mask 230 is formed. In the illustrated example, mask 230 is a tri-layer mask similar to mask 150 illustrated in FIG. 4. As with the previously described steps, it is not necessary to use a tri-layer mask, unless the particular application and feature size calls for such an approach. Regardless of the type of mask employed, a pattern is formed in mask 230 as shown in FIG. 9. Next, as shown in FIG. 10, the pattern is transferred to copper containing layer 220 using known lithography techniques. Copper containing layer 220 is preferably etched anisotropically to form nearly vertical sidewalls. In some embodiments, a chlorine plasma etch is employed to pattern copper containing layer 220. Other plasma etches, including reactive ion etching (RIE), could also be employed.

The result of the etching step is that the copper containing layer 220 is patterned into interconnect features or interconnects 280. These interconnect features 280 run across the major surface of semiconductor structure 100 and may be metal lines, metal vias, or via features to provide vertical electrical routing between metal lines. The etching stops at the annealed metal feature 201 and does not etch thereunder, thus avoiding undesirable recesses that may be formed in the prior art method and resulting in a recess free (RF) semiconductor structure 100. The faster etching rate of the copper containing layer 220 is desirable because it eliminates or reduces the amount of undercutting that will occur in the annealed metal feature 201. As can be seen from FIG. 10, there is little or no undercutting of the annealed metal feature 201.

A reason that the etching can be accurately terminated at the top surface annealed metal feature 201 and not etch thereunder is that the etch rate of the copper alloy in the annealed metal feature 201 can be controlled, as discussed above. FIG. 11 is a chart showing different etch rates of copper alloy versus pure copper at different annealing conditions. The chart shows that the etching rate of pure copper of the copper containing layer 220 etches at a faster rate when compared to the copper alloy in the metal feature 201. Put another way, the etching selectivity of the copper containing layer 220 is higher relative to the metal layer 200 after annealing. In one aspect, the etching selectivity of the copper containing layer 220 relative to the metal layer 200 after annealing is at least 5:1. According to FIG. 11, at an annealing temperature of 180 Celsius for a time period of about 90 seconds, the etch rate of pure copper is about 85 A/min, whereas the etch rate of copper alloy is slower at about 52 A/min. And at an annealing temperature of 400 Celsius for a period of about 2 hours, the etch rate of pure copper is about 100 A/min, whereas the etch rate of copper alloy is even slower at about 38 A/min. So by controlling the annealing temperature and time, the etch rate of copper metal can be controlled, in turn accurately controlling its etch rate.

Further processing steps could include depositing a dielectric layer in the openings between the interconnect features 280 and planarizing the dielectric layer. The above described process steps may be repeated for the formation of additional vertical and horizontal interconnect features.

Although the present embodiments and their advantages have been described in detail, it should be understood that various changes, substitutions and alterations can be made herein without departing from the scope of the disclosure as defined by the appended claims.

The present disclosure has described various exemplary embodiments. According to one embodiment, a method for forming a semiconductor interconnect structure comprises forming a dielectric layer on a substrate and patterning the dielectric layer to form an opening therein. The opening is filled and the dielectric layer is covered with a metal layer having a first etch rate. The metal layer is thereafter planarized so that the metal layer is co-planar with the top of the dielectric layer. The metal layer is then annealed to change the first etch rate into a second etch rate, the second etch rate being lower than the first etch rate. A copper-containing layer is formed over the annealed metal layer and the dielectric layer, wherein the copper-containing layer has an etch rate greater than the second etch rate of the annealed metal layer. The copper-containing layer is etched to form interconnect features, wherein the etching stops at the top of the annealed metal layer and does not etch thereunder.

According to another embodiment, a method for forming an integrated circuit interconnect structure comprises forming a via opening in a dielectric layer. The via opening is filled and the dielectric layer is covered with a copper alloy layer having a first etch rate. The copper alloy layer is planarized so that the copper alloy layer is co-planar with the top of the dielectric layer. The copper alloy layer is thereafter annealed. A copper-containing layer is formed over the annealed copper alloy layer and the dielectric layer. The copper-containing layer has an etch selectivity higher than the annealed copper alloy layer. The copper-containing layer is etched to form interconnect features, wherein the etching stops at the top of the annealed copper alloy layer and does not etch therein.

According to yet another embodiment, an integrated circuit interconnect structure comprises a dielectric layer on a substrate. A copper alloy feature extends substantially vertically into the dielectric layer, the copper alloy feature having a first etch rate. A plurality of copper containing interconnect features on the dielectric layer and the copper alloy feature, wherein the copper containing interconnect features comprise from about 98% to about 100% copper and have a second etch rate, the second etch rate being greater than the first etch rate.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A method for forming a semiconductor interconnect structure, comprising:
   forming a dielectric layer on a substrate;
   patterning the dielectric layer to form an opening in the dielectric layer;
   filling the opening and covering the dielectric layer with a metal layer having a first etch rate;

planarizing the metal layer so that the metal layer is co-planar with the top of the dielectric layer;

annealing the metal layer to change the first etch rate to a second etch rate, the second etch rate being lower than the first etch rate;

forming a copper-containing layer over the annealed metal layer and the dielectric layer, wherein the copper-containing layer has an etch rate greater than the second etch rate of the annealed metal layer; and etching the copper-containing layer to form interconnect features, wherein the etching stops at the top of the annealed metal layer and does not etch into the underlying annealed metal layer.

2. The method of claim 1, further comprising:
forming an etch stop layer over the substrate prior to forming the dielectric layer.

3. The method of claim 1, wherein forming the dielectric layer on the substrate comprises:
depositing a low k dielectric layer selected from the group consisting essentially of silicon oxide, silicon oxynitride, silicon carbide, and combinations thereof, using a process selected from the group consisting essentially of chemical vapor deposition, plasma enhanced chemical vapor deposition, spin on coating, and combinations thereof.

4. The method of claim 1, wherein patterning the dielectric layer to form the opening comprises:
forming a hard mask over the dielectric layer;
forming a tri-layer mask over the hard mask;
forming an opening in the tri-layer mask;
forming an opening in the hard mask using the tri-layer mask as a pattern; and
isotropically etching the opening in the dielectric layer.

5. The method of claim 1, wherein filling the opening and covering the dielectric layer with the metal layer comprises:
lining the opening in the dielectric layer with a copper alloy seed layer using a physical vapor deposition process; and
electroplating a copper alloy in the opening and over the dielectric layer.

6. The method of claim 5, wherein the copper alloy is selected from the group consisting essentially of CuMn, CuCr, CuV, CuNb, CuTi, and combinations thereof.

7. The method of claim 5, wherein the metal layer is annealed by a rapid thermal process (RTP).

8. The method of claim 5, wherein the annealing is performed on the metal layer at a temperature of from about room temperature to about 400 C for a time period of from about 1 minutes to about 180 minutes.

9. The method of claim 1, further comprising:
forming an etch stop layer over the copper-containing layer prior to etching the copper-containing layer.

10. The method of claim 1, wherein an etch selectivity of the copper-containing layer is higher relative to the metal layer after annealing.

11. The method of claim 1, wherein an etch selectivity of the copper-containing layer relative to the metal layer after annealing is at least 5:1.

12. A method for forming an integrated circuit interconnect structure, comprising:
forming a via opening in a dielectric layer;
filling the via opening and covering the dielectric layer with a copper alloy layer having a first etch rate;
planarizing the copper alloy layer so that the copper alloy layer is co-planar with the top of the dielectric layer;
annealing the copper alloy layer;
forming a copper-containing layer over the annealed copper alloy layer and the dielectric layer, wherein the copper-containing layer has an etch selectivity higher than the annealed copper alloy layer; and
etching the copper-containing layer to form interconnect features, wherein the etching stops at the top of the annealed copper alloy layer and does not etch therein.

13. The method of claim 12, wherein a material of the copper alloy layer is selected from the group consisting essentially of CuMn, CuCr, CuV, CuNb, CuTi, and combinations thereof.

14. The method of claim 12, wherein the copper alloy layer is annealed by a rapid thermal process (RTP).

15. The method of claim 12, wherein the annealing is performed on the metal layer at a temperature of from about room temperature to about 400 C for a time period of from about 1 minutes to about 180 minutes.

16. The method of claim 12, further comprising:
forming an etch stop layer over the copper-containing layer prior to etching the copper-containing layer.

17. A method for forming a semiconductor interconnect structure, comprising:
depositing a dielectric layer on a substrate;
patterning the dielectric layer to include an opening therein;
depositing within the opening a copper alloy feature having a first etch rate and extending substantially vertically into the opening in the dielectric layer, wherein no portion of the copper alloy feature is disposed outside the opening;
depositing, on the dielectric layer and the copper alloy feature in the opening, a copper containing layer comprising from about 98% to about 100% copper, the copper containing layer having a second etch rate greater than the first etch rate; and
patterning the copper containing layer to form a plurality of copper containing interconnect features.

18. The method of claim 17, wherein the step of depositing within the opening a copper alloy feature comprises electroplating or electroless plating within the opening a material selected from the group consisting of CuMn, CuCr, CuV, CuNb, CuTi, and combinations thereof.

19. The method of claim 17, wherein an etch selectivity of the copper-containing interconnect feature relative to the copper alloy feature is at least 5:1.

20. The method of claim 17, further comprising annealing the copper alloy layer.

* * * * *